(12) United States Patent
Xiao et al.

(10) Patent No.: US 12,426,249 B2
(45) Date of Patent: Sep. 23, 2025

(54) SEMICONDUCTOR STRUCTURE AND METHOD FOR MANUFACTURING SAME, AND MEMORY

(71) Applicant: CHANGXIN MEMORY TECHNOLOGIES, INC., Hefei (CN)

(72) Inventors: Deyuan Xiao, Hefei (CN); Xingsong Su, Hefei (CN); Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 542 days.

(21) Appl. No.: 17/939,009

(22) Filed: Sep. 7, 2022

(65) Prior Publication Data
US 2023/0005912 A1    Jan. 5, 2023

Related U.S. Application Data

(63) Continuation of application No. PCT/CN2022/101831, filed on Jun. 28, 2022.

(30) Foreign Application Priority Data

Jun. 21, 2022 (CN) .......................... 202210708950.4

(51) Int. Cl.
    H10B 12/00    (2023.01)
(52) U.S. Cl.
    CPC ........... H10B 12/33 (2023.02); H10B 12/036 (2023.02); H10B 12/05 (2023.02)
(58) Field of Classification Search
    CPC .. H10B 12/036; H10B 12/0383; H10B 12/05; H10B 12/33; H10B 12/482
    See application file for complete search history.

(56) References Cited

U.S. PATENT DOCUMENTS 5,571,730 A    11/1996    Park
2005/0285176 A1    12/2005    Kim
(Continued)

FOREIGN PATENT DOCUMENTS

CN    1767199 A    5/2006
CN    101874303 A    10/2010
(Continued)

OTHER PUBLICATIONS

JP office action in application No. 2022-562510, mailed on Jul. 30, 2024.

*Primary Examiner* — Edward Chin
(74) *Attorney, Agent, or Firm* — SYNCODA LLC; Feng Ma

(57) ABSTRACT

Disclosed in the embodiments of the present disclosure are a semiconductor structure and method for manufacturing same, and a memory. The semiconductor structure includes: a plurality of first active columns arranged in an array along a first direction and a second direction, a plurality of first electrodes located in first grooves arranged at intervals, a plurality of first dielectric layers, and a second electrode covering surfaces of the first dielectric layers. The first direction and the second direction are perpendicular to the extension direction of the first active column, and the first direction is intersected with the second direction. Each first electrode covers a side wall of one of the first active columns. Each first groove surrounds a surface of each first active column. Each first dielectric layer covers the side wall of one of the first electrodes and a bottom of a gap between two adjacent first electrodes.

19 Claims, 14 Drawing Sheets

(56) References Cited

U.S. PATENT DOCUMENTS

| | | |
|---|---|---|
| 2008/0035976 A1 | 2/2008 | Kim |
| 2009/0134491 A1 | 5/2009 | Plum |
| 2010/0295110 A1 | 11/2010 | Takaishi |
| 2011/0244302 A1 | 10/2011 | Wasson |
| 2012/0156844 A1* | 6/2012 | Kim .................... H10D 64/687 438/270 |
| 2013/0148260 A1 | 6/2013 | Wasson |
| 2013/0234240 A1 | 9/2013 | Moon et al. |
| 2014/0035018 A1 | 2/2014 | Lee |
| 2015/0001617 A1 | 1/2015 | Kim et al. |
| 2015/0348976 A1 | 12/2015 | Moon et al. |
| 2018/0308923 A1 | 10/2018 | Wu et al. |
| 2019/0103407 A1 | 4/2019 | Kim et al. |
| 2019/0189617 A1 | 6/2019 | Kim et al. |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0243532 A1 | 7/2020 | Kim et al. |
| 2021/0057416 A1 | 2/2021 | Kim et al. |
| 2021/0066306 A1 | 3/2021 | Tang et al. |
| 2021/0151440 A1 | 5/2021 | Tang et al. |
| 2021/0202485 A1 | 7/2021 | Inaba |
| 2021/0202490 A1 | 7/2021 | Cho et al. |
| 2022/0052151 A1 | 2/2022 | Wang |
| 2022/0173109 A1 | 6/2022 | Rigano |
| 2022/0246621 A1 | 8/2022 | Cho et al. |

FOREIGN PATENT DOCUMENTS

| | | | | |
|---|---|---|---|---|
| CN | 103311249 A | | 9/2013 | |
| CN | 108735744 A | | 11/2018 | |
| CN | 109065501 A | | 12/2018 | |
| CN | 109616474 A | | 4/2019 | |
| CN | 113078116 A | | 7/2021 | |
| CN | 113611671 A | * | 11/2021 | ........... H10D 64/667 |
| CN | 113707614 A | | 11/2021 | |
| CN | 114068414 A | | 2/2022 | |
| CN | 114078777 A | | 2/2022 | |
| CN | 114093821 A | | 2/2022 | |
| CN | 114256240 A | | 3/2022 | |
| CN | 114342065 A | | 4/2022 | |
| CN | 114373764 A | | 4/2022 | |
| CN | 114551450 A | | 5/2022 | |
| CN | 114582808 A | | 6/2022 | |
| JP | H0864777 A | | 3/1996 | |
| JP | H1152660 A | | 2/1999 | |
| JP | 2006216649 A | * | 8/2006 | ............. H10D 1/716 |
| JP | 2013168570 A | * | 8/2013 | |

* cited by examiner

SEMICONDUCTOR STRUCTURE AND METHOD FOR MANUFACTURING SAME, AND MEMORY

CROSS-REFERENCE TO RELATED APPLICATION

The present disclosure is a U.S. continuation application of International Application No. PCT/CN2022/101831, filed on Jun. 28, 2022, which is based upon and claims priority to Chinese patent application No. 202210708950.4, filed on Jun. 21, 2022. The disclosures of International Application No. PCT/CN2022/101831 and Chinese patent application No. 202210708950.4 are hereby incorporated by reference in their entireties.

TECHNICAL FIELD

The present disclosure relates to the technical field of semiconductors, specifically to a semiconductor structure and a method for manufacturing the same, and a memory.

BACKGROUND

A storage array architecture of a Dynamic Random Access Memory (DRAM) is an array consisting of storage units, and each of storage units includes one Transistor (T) and one Capacitor (C) (1T1C) (i.e., the storage unit of 1T1C). The gate of the transistor is connected to a Word Line (WL), the drain is connected to a Bit Line (BL), and the source is connected to the capacitor.

As the size of the DRAM becomes smaller and smaller, the size of the capacitor becomes smaller. How to ensure the performance of the capacitor in the DRAM becomes an urgent problem to be solved.

SUMMARY

In view of this, embodiments of the present disclosure propose a semiconductor structure and a method for manufacturing the same, and a memory.

According to an aspect of the present disclosure, a semiconductor structure is provided. The semiconductor structure includes: a plurality of first active columns, a plurality of first electrodes, a plurality of first dielectric layers, and second electrodes.

The plurality of first active columns are arranged in an array along a first direction and a second direction. Both the first direction and the second direction are perpendicular to an extension direction of each of the first active columns, and the first direction is intersected with the second direction.

Each of the first electrodes covers a side wall of one of the first active columns. The first electrodes are located in first grooves arranged at intervals. Each of the first grooves surrounds a surface of each of the first active columns.

Each of the first dielectric layers covers a side wall of one of the first electrodes and a bottom of a gap between two adjacent first electrodes.

The second electrodes cover surfaces of the plurality of first dielectric layers.

According to another aspect of the present disclosure, a memory is provided. The memory includes one or more semiconductor structures as described in any of the above solutions of the present disclosure.

According to another aspect of the present disclosure, a method for manufacturing a semiconductor structure is provided. The method includes the following operations.

A substrate is provided, and a plurality of first semiconductor columns are formed on the substrate and arranged in an array along a first direction and a second direction. Both the first direction and the second direction are perpendicular to an extension direction of the first semiconductor column, and the first direction is intersected with the second direction.

An oxidizing treatment is performed on the plurality of first semiconductor columns to form oxide layers on surfaces of the first semiconductor columns.

A first sacrificial material is filled in a gap between the oxide layers.

Part of the oxide layer is removed to obtain a first active column and a first groove.

A first electrode is formed in the first groove.

Part of the first sacrificial material in the gap between the oxide layers is removed to form a second groove.

A first dielectric layer covering a side wall and a bottom of the second groove is formed.

A second electrode is formed in the second groove formed with the first dielectric layer.

DETAILED DESCRIPTION

Figure 1:
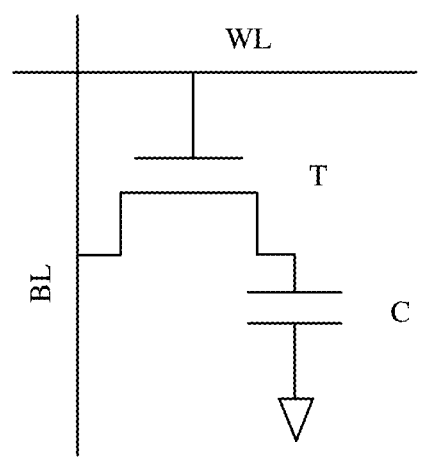
FIG. 1 schematically shows a circuit connection of a DRAM transistor provided in an embodiment of the present disclosure.

For making the technical solutions and advantages of the embodiments of the present disclosure clearer, the technical solutions of the present disclosure are further described in details below in combination with the accompanying drawings and the embodiments. Although the exemplary implementation modes of the present disclosure are shown in the drawings, it should be understood that the present disclosure may be implemented in various forms and shall not be limited by the implementation modes described here. Rather, these implementation modes are provided for more fully understanding of the present disclosure and to completely convey the scope of the present disclosure to those skilled in the art.

The present disclosure is more specifically described below by means of examples. The advantages and features of the present disclosure will be clearer according to the following description and claims. It is to be noted that the accompanying drawings are all in a very simplified form without precise scale to assist in illustrating the purpose of the embodiments of the present disclosure easily and clearly.

It should be understood that the meaning of "on", "over" and "above" in the present disclosure should be interpreted in the broadest possible way, so that when one object is referred to as being "on . . . " other objects, it may means not only that an object may be on the other objects without intermediate elements or layers (that is, the object is directly on the other objects), but also that an object is on the other objects with intermediate elements or layers therebetween.

In addition, Spatial relation terms, such as "on", "over", "above . . . ", "upper" and "upper part" and the like for conveniently describing a relationship between one element or feature shown in the drawings and other elements or features in the present disclosure. In addition to the orientation described in the accompanying drawings, the spatial relation terms are intended to cover different orientations of a device in use or operation. A device may be oriented in other ways (rotated 90 degrees or in other orientations), and the spatial relation terms used here are interpreted accordingly.

In the embodiments of the present disclosure, the term "substrate" refers to a material on which subsequent material layers are added. The substrate itself may be patterned. The material added to the top of the substrate may be patterned or may remain un-patterned. In addition, the substrate may include a variety of semiconductor materials, such as silicon, silicon germanium, germanium, gallium arsenide, and indium phosphide. Alternatively, the substrate may be made of non-conductive materials, such as glass, plastic, or sapphire wafer.

In the embodiments of the present disclosure, the term "layer" refers to a material part that includes an area with thickness. The layer may extend over the entirety of the structure below it or above it, or may have an area smaller than the area of the structure below it or above it. Moreover, the layer may be an area with a homogeneous or heterogeneous continuous structure whose thickness is less than that of a continuous structure. For example, the layer may be between the top surface and the bottom surface of the continuous structure, or the layer may be between any horizontal surface pair at the top surface and bottom surface of the continuous structure. The layer may extend horizontally, vertically and/or along an inclined surface. The layer may include multiple sub-layers. For example, an interconnection layer may include one or more conductor and contact sub-layers (which form interconnection wires and/or through-hole contacts), and one or more dielectric sub-layers.

Terms "first", "second" and the like in the embodiments of the present disclosure are adopted to distinguish similar objects and not intended to describe a specific sequence or order.

The semiconductor structure involved in the embodiments of the present disclosure will be used in the subsequent processing to form at least a part of the structure of final devices. Here, the final devices may include a memory. The memory includes, but is not limited to, a DRAM. The DRAM is only taken as an example for description below.

It is to be noted that the description about the DRAM in the following embodiments is only used for illustrating the present disclosure, but not for limiting the scope of the present disclosure.

With the development of the DRAM technology, the size of a storage unit becomes smaller and smaller, and its array architecture changes from $8F^2$ to $6F^2$ to $4F^2$. In addition, based on the requirements for ions and leakage current in the DRAM, the architecture of the memory changes from a planar array transistor to a recess gate array transistor, from the recess gate array transistor to a buried channel array transistor, and then from the buried channel array transistor to a vertical channel array transistor.

In some embodiments of the present disclosure, whether the planar array transistor, the recess gate array transistor, the buried channel array transistor or the vertical channel array transistor, the DRAM is composed of multiple storage units. The structure of each storage unit is mainly composed of a transistor and a storage unit (storage capacitor) controlled by the transistor. That is, the DRAM includes the architecture (1T1C) of one transistor (T) and one capacitor (C). The main working principle thereof is to use the amount of charges stored in the capacitor to represent whether a binary bit is 1 or 0.

FIG. 1 schematically shows a circuit connection using the architecture of 1T1C provided in an embodiment of the present disclosure. As shown in FIG. 1, the drain of the transistor T is electrically connected to a bit line (BL). The source of the transistor T is electrically connected to one electrode plate of the capacitor C, and another electrode plate of the capacitor C may be connected to a reference voltage which may be a ground voltage or other voltages. The gate of the transistor T is connected to a word line (WL). The transistor T is controlled to be turned on or off by applying a voltage through the word line WL, and the bit line BL is used to perform read or write operations on the transistor T when the transistor T is turned on.

However, in order to realize the miniaturization of memories, the size of the DRAM becomes smaller and smaller, and the size of the capacitor also becomes smaller, which makes the process of forming the capacitor more and more difficult. Meanwhile, there is a problem of electric leakage of the capacitor during the use, and there is a problem of mutual interference among multiple lower electrode plates in the capacitor.

Figure 2:
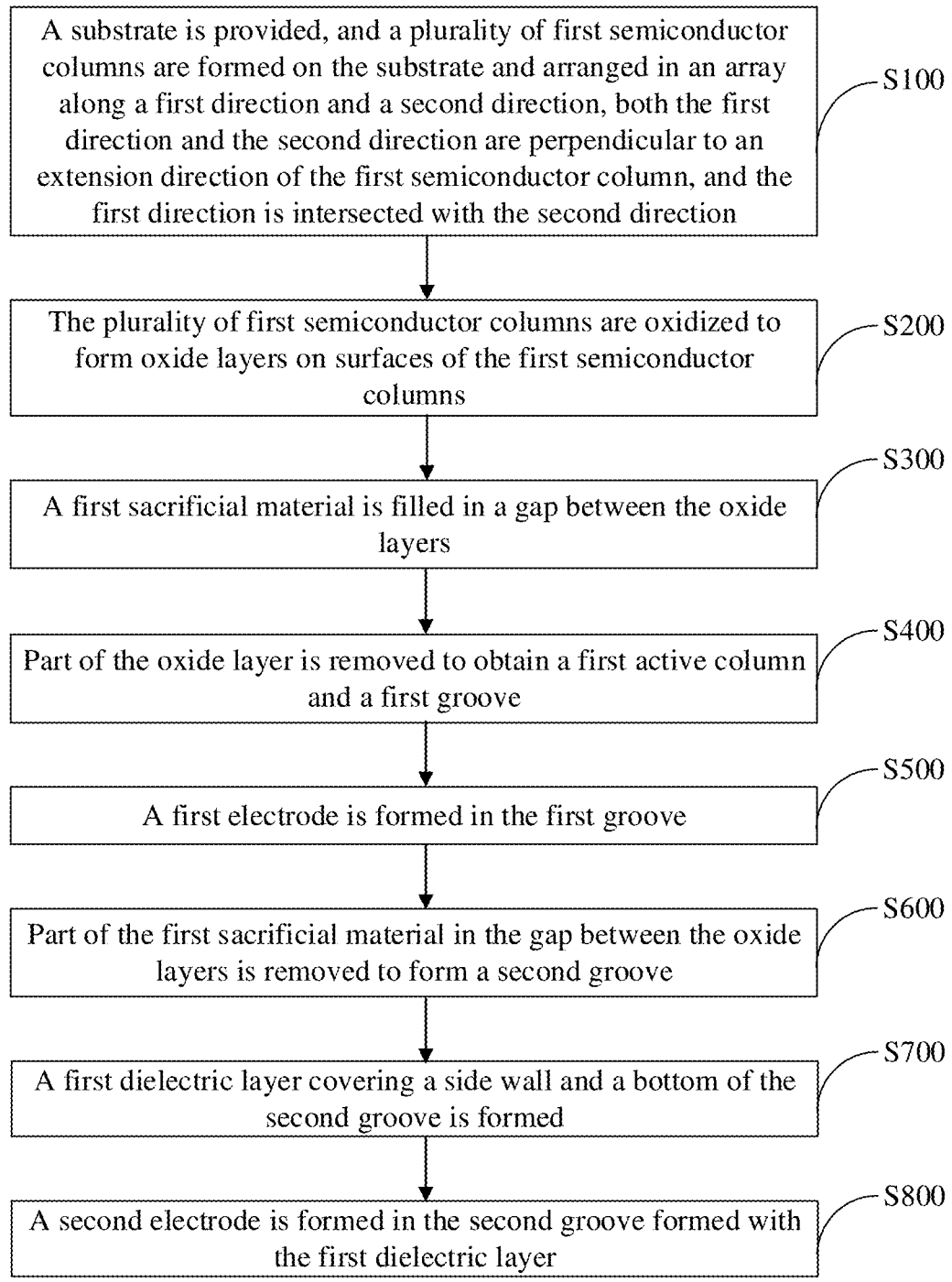
FIG. 2 shows a flowchart of a method for manufacturing a semiconductor structure provided in an embodiment of the present disclosure.

Based on this, in order to solve one or more of the above problems, the embodiments of the present disclosure provide a method for manufacturing a semiconductor structure, which can improve the problem of electric leakage of the capacitor and the problem of mutual interference among multiple lower electrode plates in the capacitor. FIG. 2 shows a flowchart of a method for manufacturing a semiconductor structure provided in an embodiment of the present disclosure. As illustrated in FIG. 2, the method for manufacturing a semiconductor structure provided in an embodiment of the present disclosure may include the following steps.

At S100, a substrate is provided, and a plurality of first semiconductor columns are formed on the substrate and arranged in an array along a first direction and a second direction. Both the first direction and the second direction are perpendicular to an extension direction of the first semiconductor column, and the first direction is intersected with the second direction.

At S200, An oxidizing treatment is performed on the plurality of first semiconductor columns to form oxide layers on surfaces of the first semiconductor columns.

At S300, a first sacrificial material is filled in a gap between the oxide layers.

At S400, part of the oxide layer is removed to obtain a first active column and a first groove.

At S500, a first electrode is formed in the first groove.

At S600, part of the first sacrificial material in the gap between the oxide layers is removed to form a second groove.

At S700, a first dielectric layer covering a side wall and a bottom of the second groove is formed.

At S800, a second electrode is formed in the second groove formed with the first dielectric layer.

It should be understood that the steps shown in FIG. 2 are not exclusive, and additional steps may also be performed before or after any step, or between any steps in the illustrated operations. The sequence of the steps shown in FIG. 2 may be adjusted according to actual needs. FIG. 3A to FIG. 3L show semiconductor structures during a manufacturing process provided in an embodiment of the present disclosure. It is to be noted that FIG. 3A to FIG. 3L constitute a complete process schematic diagram for the realization of the method for manufacturing a semiconductor structure. Unmarked parts in some accompanying drawings can be shared with each other. The method for manufacturing a semiconductor structure provided by the embodiments of the present disclosure is described in detail below in combination with FIG. 2 and FIG. 3A to FIG. 3L.

At S100, a substrate 101 is provided, and a plurality of first semiconductor columns 102-1 are formed on the substrate 101.

In some embodiments, the formation of the plurality of first semiconductor columns 102-1 arranged in an array along a first direction and a second direction may include the following operations. The substrate 101 is etched to form a plurality of first trenches 110 arranged at intervals along the first direction and a plurality of second trenches 111 arranged at intervals along the second direction on the substrate 101. An enlarging treatment is performed on a bottom of the first trench 110 and/or the second trench 111, to make each of the first semiconductor columns 102-1 to include a first part 113 and a second part 112 located on the first part 113. The maximum diameter width of the first part 113 is less than the minimum diameter width of the second part 112.

In some specific examples, the substrate 101 may include monoatomic elemental semiconductor material substrates (e.g., a silicon (Si) substrate and a germanium (Ge) substrate), compound semiconductor material substrates (e.g., a germanium-silicon (SiGe) substrate), Silicon on Insulator (SOI) substrates, Germanium on Insulator (GeOI) substrates, etc. Preferably, the substrate is the silicon substrate.

In some specific examples, the substrate 101 may be formed by Physical Vapor Deposition (PVD) process, Chemical Vapor Deposition (CVD) process, Atomic Layer Deposition (ALD) process, etc.

The process of forming the first semiconductor column 102-1 is described in detail below in combination with FIG. 3A to FIG. 3D.

Figure 3A:
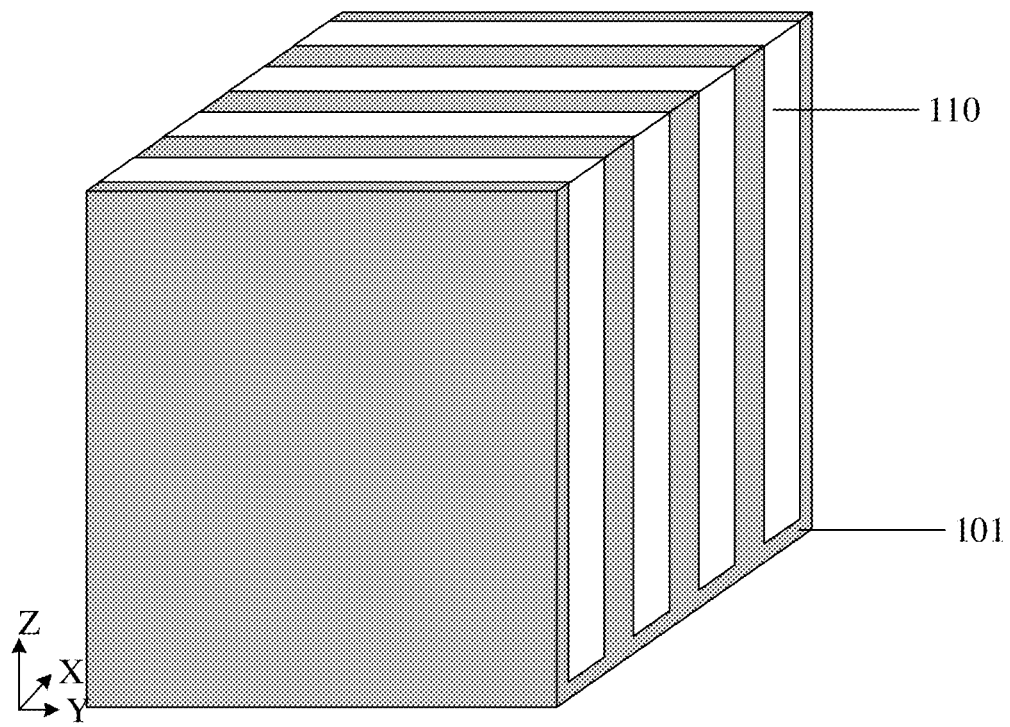
FIG. 3A to FIG. 3L show section diagrams of semiconductor structures during a manufacturing process provided in an embodiment of the present disclosure.

As shown in FIG. 3A, a first etching is performed on the surface of the substrate 101 to form a plurality of first trenches 110 arranged at intervals along the first direction in the substrate 101. Here, each of the first trenches 110 extends along the second direction.

Here, the first direction is parallel to the surface of the substrate 101. The second direction is intersected with the first direction, and is parallel to the surface of the substrate 101. The third direction is the extension direction of the first semiconductor column 102-1 and is perpendicular to the surface of the substrate 101.

Here, the expression "the first direction is intersected with the second direction" may be interpreted as the included angle between the first direction and the second direction is between 0 degree and 90 degrees.

In order to describe the present disclosure clearly, the following embodiments are described taking that the first direction is perpendicular to the second direction as an example. Exemplarily, the first direction is the X-axis direction shown in FIG. 3A, the second direction is the Y-axis direction shown in FIG. 3A, and the third direction is the Z-axis direction shown in FIG. 3A. It is to be noted that the description about the direction in the following embodiments is only used for illustrating the present disclosure, but not for limiting the scope of the present disclosure.

In some specific examples, the first trench 110 includes, but is not limited to, a Shallow Trench Isolation (STI) structure.

In some specific examples, the method for forming the first trench 110 includes, but is not limited to, a dry plasma etching process.

Figure 3B:
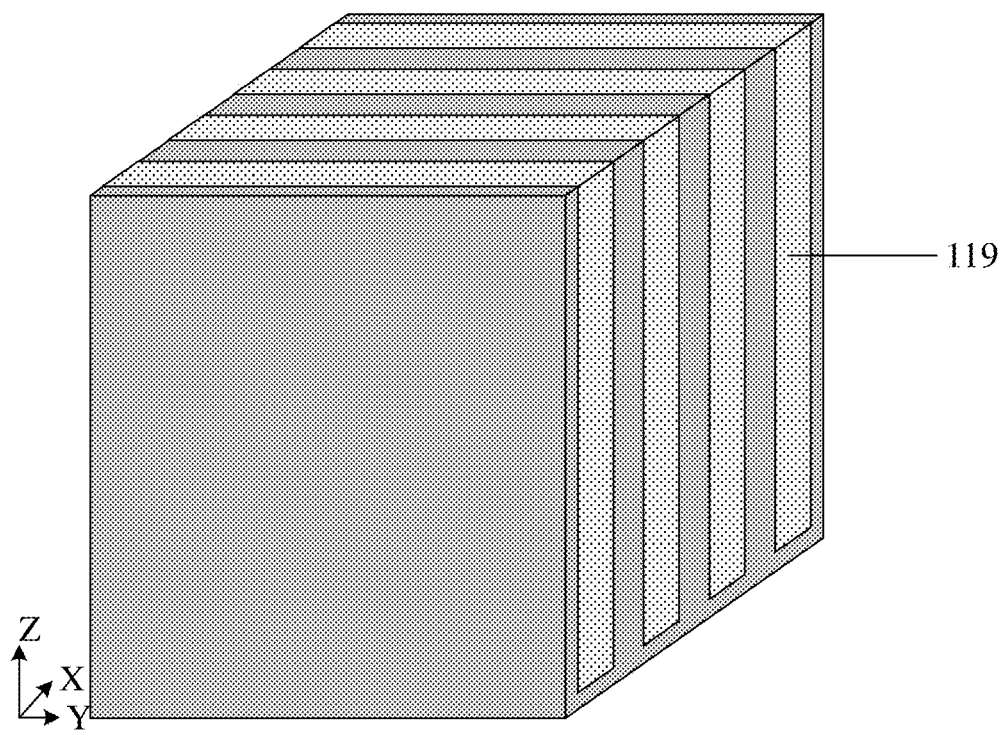

As shown in FIG. 3B, a first insulating layer 119 is formed in the first trench 110. The top surface of the first insulating layer 119 is basically flush with the top surface of the substrate 101. Here, the first insulating layer 119 is used for supporting.

In some specific examples, materials of the first insulating layer 119 include, but are not limited to, silicon oxide ($SiO_2$).

In some specific examples, the method for forming the first insulating layer 119 includes, but is not limited to, PVD, CVD, ALD, and other processes.

Figure 3C:
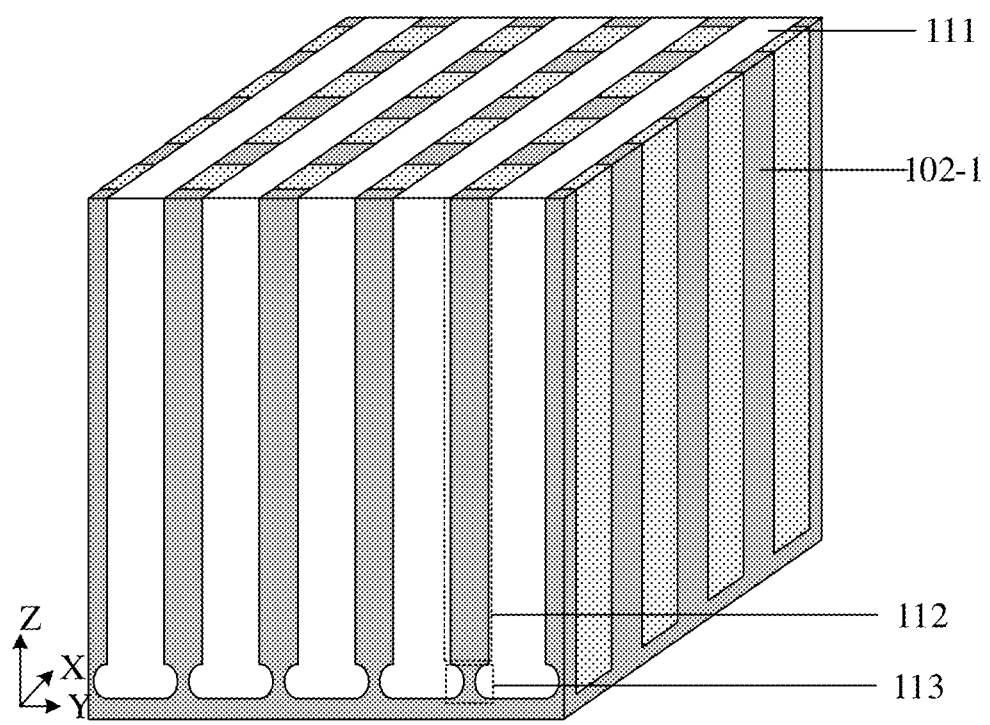

As shown in FIG. 3C, a second etching is performed on the substrate 101 formed with the first insulating layer 119 to form a plurality of second trenches 111 in the substrate 101. The plurality of second trenches 111 are arranged at intervals along the second direction, and each of the second trenches 111 extends along the first direction. That is, the first trench 110 is intersected with the second trench 111.

In some specific examples, when the first direction is perpendicular to the second direction, the first trench 110 and the second trench 111 are perpendicular to each other.

In some specific examples, the plurality of the first trenches 110 are arranged at intervals along the X-axis direction, and each of the first trenches 110 extends along the Y-axis direction. The plurality of the second trenches 111 are arranged at intervals along the Y-axis direction, and each of the second trenches 111 extends along the X-axis direction.

In some specific examples, the method for forming the second trench 111 includes, but is not limited to, a dry plasma etching process.

In some specific examples, the second trench 111 includes, but is not limited to, an STI structure.

In some specific examples, the depth of the first trench 110 along the third direction may be the same as or different from the depth of the second trench 111 along the third direction.

Preferably, the depth of the first trench 110 along the third direction is the same as the depth of the second trench 111 along the third direction. In this way, the adjustment of process parameters in a manufacturing process can be reduced, and thus the process difficulty can be reduced.

Here, the first trench 110 and the second trench 111 divide the substrate 101 into a plurality of first semiconductor columns 102-1 arranged in an array along the first direction and the second direction.

In some specific examples, the plurality of first semiconductor columns 102-1 arranged in an array along the first direction and the second direction in the substrate 101 may be formed by forming a grid-like mask layer on the surface of the substrate 101, and then etching the substrate 101 with the grid-like mask layer as the mask to form the first trench 110 and the second trench 111 simultaneously.

Next, as shown in FIG. 3C, an enlarging treatment is performed on the bottom of each of the first trenches 110 and/or the second trenches 111. Here, the enlarging treatment may be interpreted as etching the bottom of the first trench 110 along the first direction, and/or, etching the bottom of the second trench 111 along the second direction, so that the diameter width of the bottom of the first trench 110 and/or the second trench 111 along the first direction is greater than the diameter width of the top of the corresponding trench along the first direction, and/or, the diameter width of the bottom of the first trench 110 and/or the second trench 111 along the second direction is greater than the diameter width of the top of the corresponding trench along the second direction.

In some specific examples, the etching processes used may include wet etching process, dry etching process, etc.

Exemplarily, in the wet etching process, an etching agent is introduced into the bottom of the first trench 110 and/or the second trench 111 to through the anisotropic etching of the etching agent, increase the diameter width of the bottom of the first trench 110 and/or the second trench 111 along the X-axis direction, and/or, increase the diameter width of the bottom of the first trench 110 and/or the second trench 111 along the Y-axis direction.

Exemplarily, in the dry etching process, lateral etching is performed by controlling the plasma to form a trench structure with an enlarged diameter width at the bottom of the first trench 110 and/or the second trench 111.

In the embodiments of the present disclosure, after performing the enlarging treatment on the bottom of each of the first trenches 110 and/or the second trenches 111, the bottom areas of the plurality of first semiconductor columns 102-1 on the substrate 101 are etched via the etching process, so that the size of the bottom area of each of the first semiconductor columns 102-1 is reduced.

In other words, the first semiconductor column 102-1 includes the first part 113 and the second part 112 located on the first part 113. Here, the second part 112 of the first semiconductor column 102-1 is located on the first part 113 of the first semiconductor column 102-1.

Exemplarily, when only the first trench 110 is subjected with the enlarging treatment, the maximum diameter width of the first part 113 of the first semiconductor column 102-1 along the X-axis direction is less than the minimum diameter width of the second part 112 of the first semiconductor column 102-1 along the X-axis direction.

Exemplarily, when only the second trench 111 is subjected with the enlarging treatment, the maximum diameter width of the first part 113 of the first semiconductor column 102-1 along the Y-axis direction is less than the minimum diameter width of the second part 112 of the first semiconductor column 102-1 along the Y-axis direction.

Exemplarily, when both the first trench 110 and the second trench 111 are subjected with the enlarging treatment, the maximum diameter width of the first part 113 of the first semiconductor column 102-1 along the X-axis direction is less than the minimum diameter width of the second part 112 of the first semiconductor column 102-1 along the X-axis direction and the maximum diameter width of the first part 113 of the first semiconductor column 102-1 along the Y-axis direction is less than the minimum diameter width of the second part 112 of the first semiconductor column 102-1 along the Y-axis direction.

Preferably, both the first trench 110 and the second trench 111 are subjected with the enlarging treatment to reduce the size of the first part 113 of the first semiconductor column 102-1.

Exemplarily, the maximum diameter width of the first part 113 may be understood as the diameter width at the position wherein the first part 113 of the first semiconductor column 102-1 is contacted with the second part 112 of the first semiconductor column 102-1 in FIG. 3C. The minimum diameter width of the second part 112 may be understood as the diameter width of the area with the minimum size in the second part 112 of the first semiconductor column 102-1. Referring to FIG. 3C, the upper and lower parts of the second part 112 of the first semiconductor column 102-1 have the same size. That is, the minimum diameter width of the second part 112 of the first semiconductor column 102-1 is the same as the maximum diameter width of the second part 112 of the first semiconductor column 102-1.

Figure 3D:
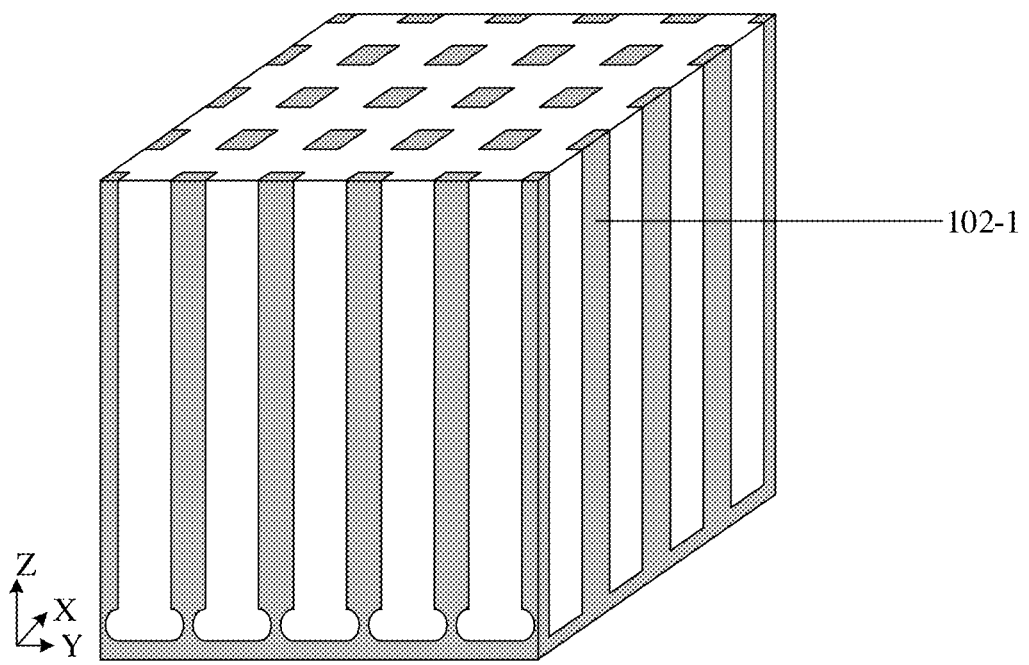

Next, as shown in FIG. 3D, the first insulating layer 119 is removed from the first trench 110. In some specific examples, the method for removing the first insulating layer 119 includes, but is not limited to, a wet etching process and a dry etching process.

At S200, the oxide layer 103 is formed on the surface of the first semiconductor column 102-1.

In some embodiments, the formation of the oxide layer 103 on the surface of the first semiconductor column 102-1 may include the following operations.

The oxidizing treatment is performed on the first semiconductor column 102-1 to completely oxidize the first part 113 into an oxide column 103-1, oxidize the exposed surface of the second part 112 into a first oxide layer 103-2, and oxidize the surface of the substrate 101 into a second oxide layer 103-3.

Figure 3E:
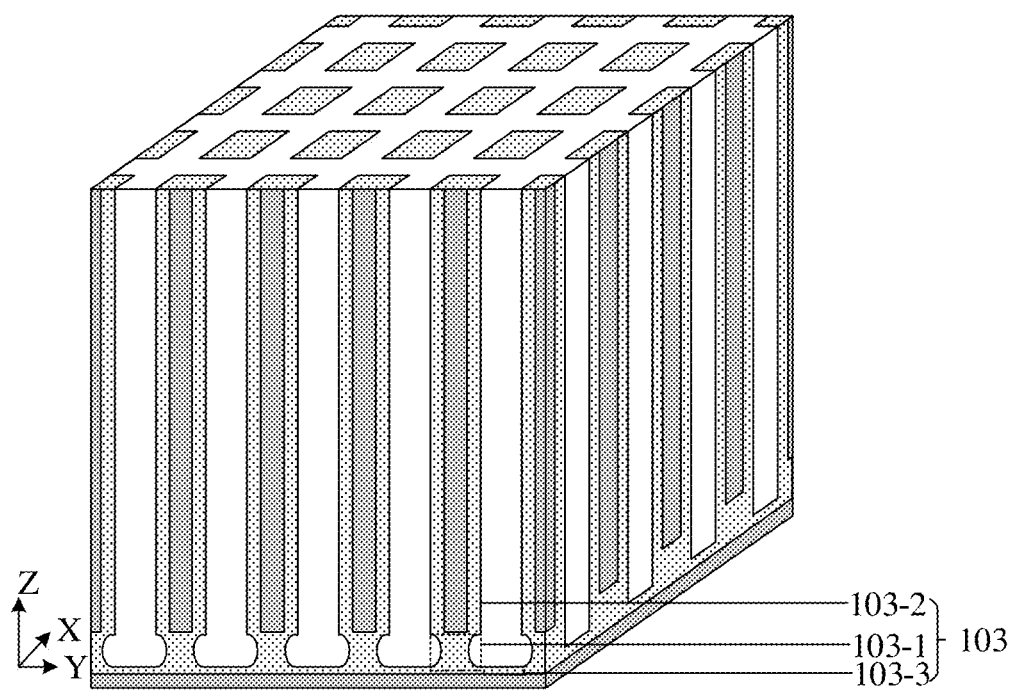

As shown in FIG. 3E, the first semiconductor column 102-1 is subjected with the oxidizing treatment by an oxidation process, for example, a thermal oxidation process, so that all the first part 113 of the first semiconductor column 102-1 is oxidized into the oxide column 103-1, the exposed surface of the second part 112 of the first semiconductor column 102-1 is oxidized into the first oxide layer 103-2, and the surface of the substrate 101 is also oxidized to form the second oxide layer 103-3 at the same time.

It is understandable that the second oxide layer 103-3 formed here enables a capacitor formed in the subsequent process to be isolated from the substrate 101 at the bottom, thereby improving the problem of electric leakage at the bottom of the capacitor.

Here, the first oxide layer 103-2, the second oxide layer 103-3, and the oxide column 103-1 together form the oxide layer 103.

Here, the first oxide layer 103-2, the second oxide layer 103-3 and the oxide column 103-1 have the same materials. Exemplarily, the constituent materials of the first oxide layer 103-2, the second oxide layer 103-3 and the oxide column 103-1 include, but are not limited to, silicon oxide.

In some specific examples, the material of the oxide layer 103 is the same as or different from the material of the first insulating layer 119.

It is to be noted that, after the first trench 110 and/or the second trench 111 are/is subjected with the enlarging treatment in the above embodiments, the first part 113 of the first semiconductor column 102-1 has a smaller size, so it is easy to be completely oxidized. And when the first part 113 of the first semiconductor column 102-1 is completely oxidized, only the surface of the second part 112 of the first semiconductor column 102-1 is oxidized.

At S300, the first sacrificial material 104-1 is filled.

In some embodiments, the filling of the first sacrificial material 104-1 in the gap between the oxide layers 103 may include the following operations.

The first sacrificial material 104-1 is filled in the gap between the plurality of oxide columns 103-1 and the gap between the first oxide layers 103-2.

Figure 3F:
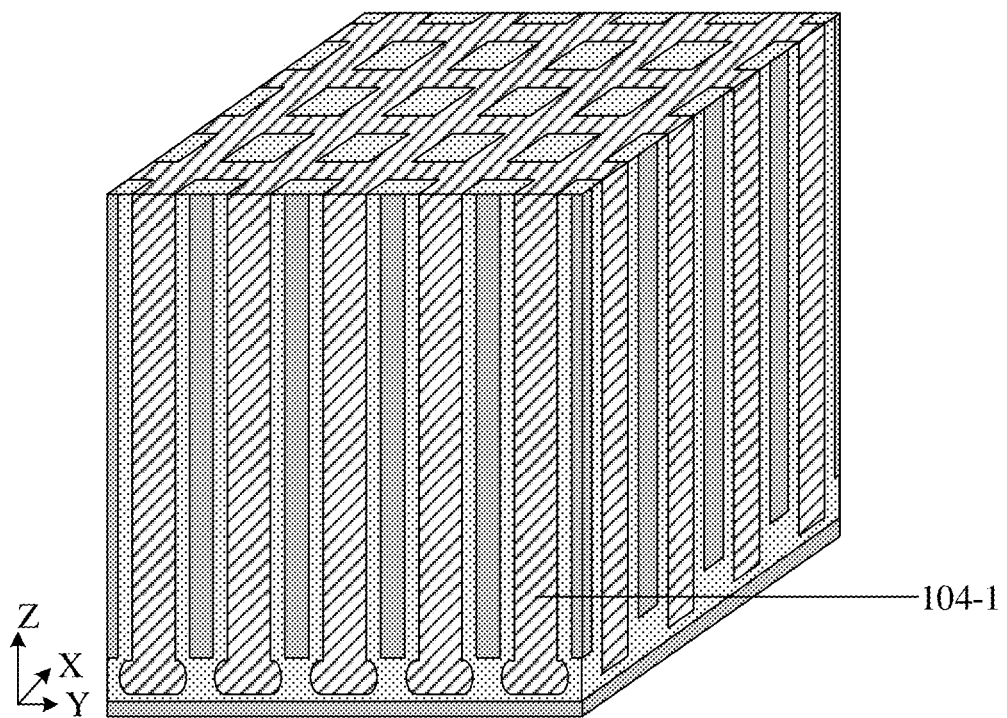

As shown in FIG. 3F, the first sacrificial material 104-1 is filled in the gap between the oxide layers 103. Specifically, the first sacrificial material 104-1 is filled in the gap between the first oxide layers 103-2 and the gap between the oxide columns 103-1.

In some specific examples, the method for filling the first sacrificial material 104-1 includes, but is not limited to, PVD, CVD, and ALD.

In some specific examples, the material used for the first sacrificial material 104-1 includes, but is not limited to, polysilicon, carbon or the like.

Here, the material used for the first sacrificial material 104-1 can be selected based on the following aspects: first, it is necessary to consider that the first sacrificial material 104-1 has a certain etch selectivity ratio relative to the first oxide layer 103-2, so that the first sacrificial material 104-1 can be retained when the first oxide layer 103-2 is removed in subsequent processes to form the first groove 105; second, it is necessary to consider that the first sacrificial material 104-1 has a certain etch selectivity ratio relative to the material of the first electrode 106 formed in subsequent processes, so that the influence on the formed first electrode 106 is reduced when the first sacrificial material 104-1 is removed in subsequent processes to form the first sacrificial layer 104; third, it is necessary to consider that the first sacrificial material 104-1 can be easily removed in subsequent processes.

At S400, the first active column 102 and the first groove 105 are formed.

Figure 3G:
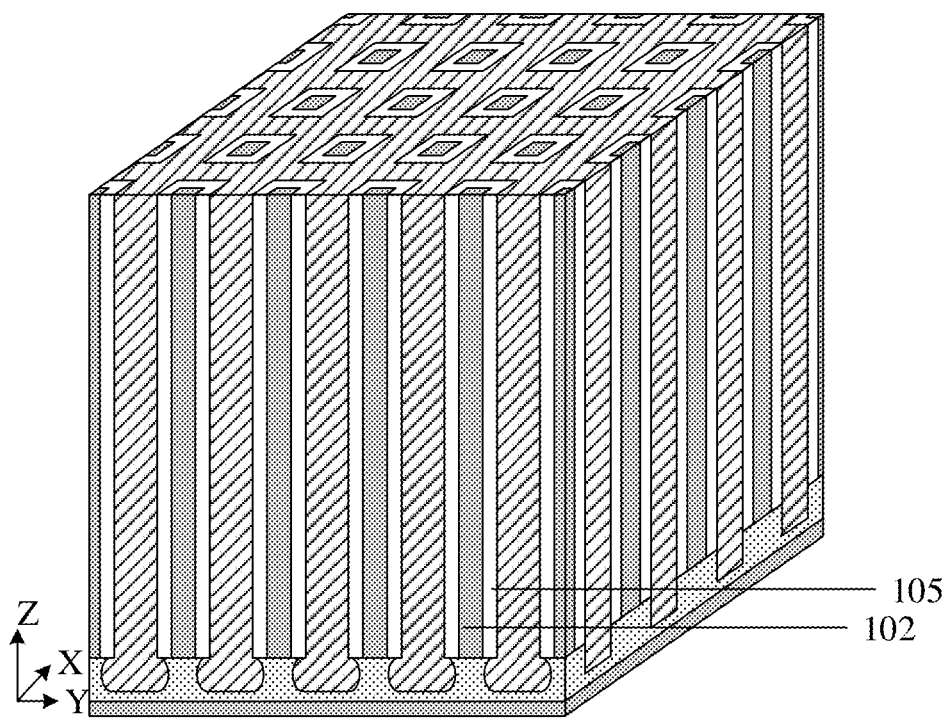

As shown in FIG. 3G, the first oxide layer 103-2 is removed to form the first groove 105. The first semiconductor column 102-1 from which the first oxide layer 103-2 has been removed forms the first active column 102.

In some specific examples, the method for removing the first oxide layer 103-2 includes, but is not limited to, a wet etching process and a dry etching process.

At S500, the first electrode 106 is formed.

Figure 3H:
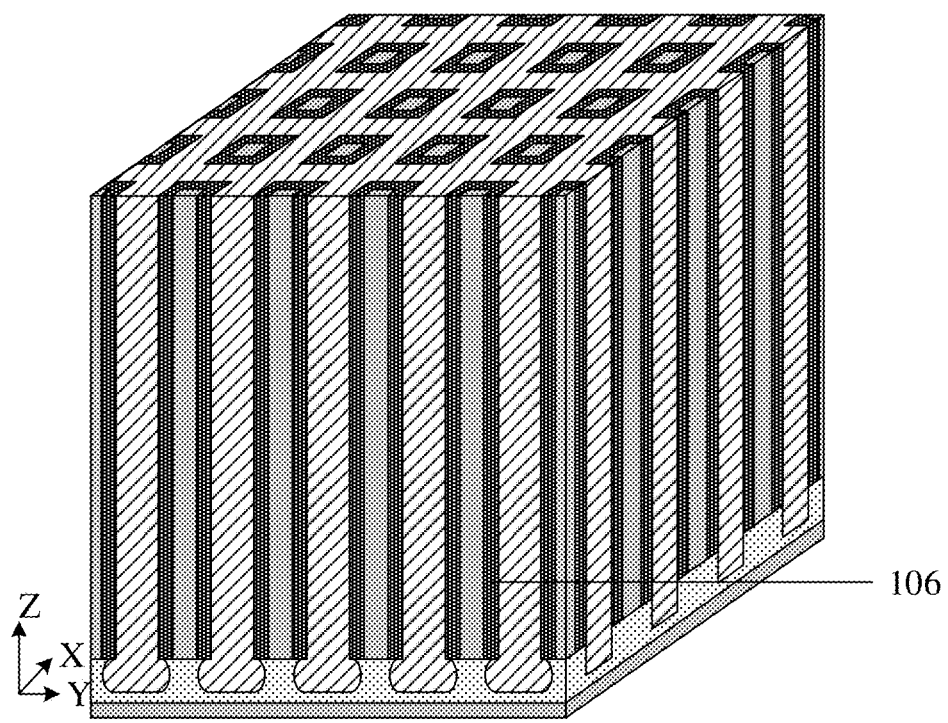

As shown in FIG. 3H, the material of the first electrode 106 is filled in the first groove 105 to form the first electrode 106.

Here, the first electrode 106 is used as the lower electrode of a capacitor.

In some specific embodiments, the constituent materials of the first electrode 106 may include, but are not limited to, ruthenium (Ru), ruthenium oxide (RuO) and titanium nitride (TiN).

In the embodiments of the present disclosure, the methods for forming the first electrode 106 include, but are not limited to, PVD, CVD, and ALD.

It is understandable that, in the embodiments of the present disclosure, the first groove 105 is formed after the first oxide layer 103-2 is removed, and the formed first groove 105 surrounds the first semiconductor column 102-1. All the first sacrificial materials 104-1 filled in the gap between the first semiconductor columns 102-1 are connected together. The material for forming the first electrode 106 is directly filled in the first groove 105, thereby forming the first electrode 106. Because the first grooves 105 are separated from each other, the first electrodes 106 formed are also separated from each other. In traditional methods, the material for forming the first electrode 106 is directly deposited in the first trench 110 and the second trench 111 in the gap between the first semiconductor columns 102-1 to form a plurality of first electrodes 106, which makes the bottoms of the plurality of first electrodes 106 unable to be separated from each other, so that the first electrodes 106 interfere with each other. However, the first electrodes 106 formed by the solution of the embodiments of the present disclosure can be separated from each other, so the problem of mutual interference between the plurality of first electrodes 106 can be improved.

At S600, part of the first sacrificial material 104-1 is removed to form the second groove 109.

In some embodiments, when the first sacrificial material 104-1 in the gap between the first oxide layers 103-2 is removed to form the second groove 109, the first sacrificial material 104-1 in the gap between the plurality of the oxide columns 103-1 is retained to form a first sacrificial layer 104.

Figure 3I:
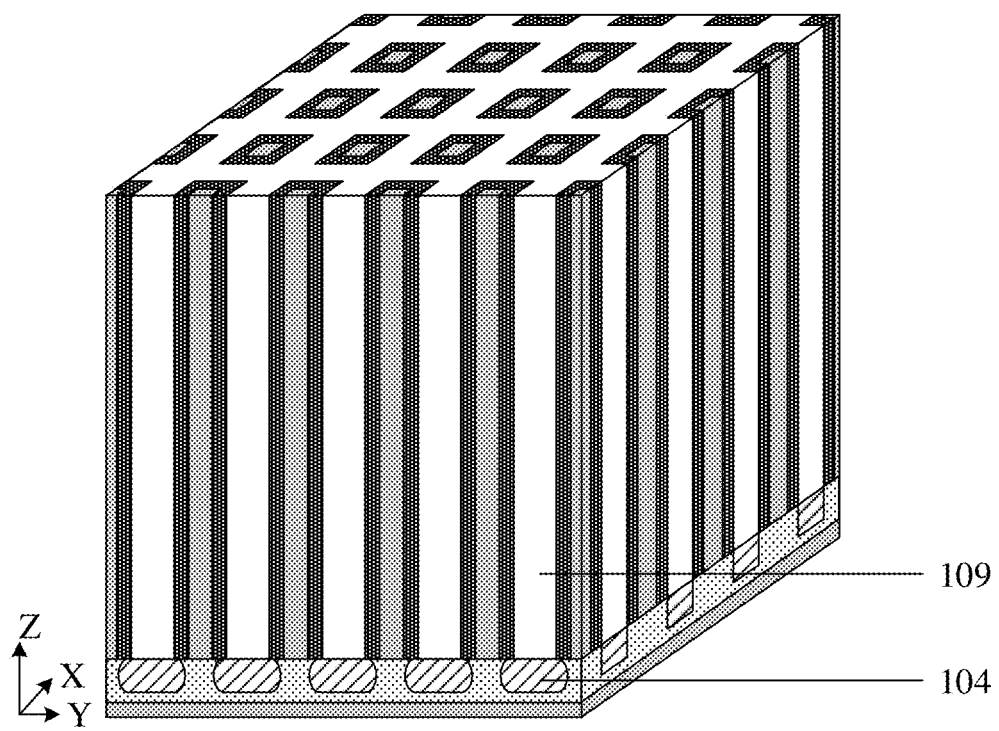

As shown in FIG. 3I, the first sacrificial material 104-1 in the gap between the first oxide layers 103-2 is removed to form the second groove 109, and the first sacrificial material 104-1 in the gap between the oxide columns 103-1 is retained. The remained first sacrificial material 104-1 forms the first sacrificial layer 104.

In some specific examples, the method for removing the first sacrificial material 104-1 in the gap between the first oxide layers 103-2 includes, but is not limited to, a wet etching process and a dry etching process. Exemplarily, when the first sacrificial material 104-1 in the gap between the first oxide layers 103-2 is removed by the etching process, the purpose of etching only the first sacrificial material 104-1 in the gap between the first oxide layers 103-2 while retaining the first sacrificial material 104-1 in the gap between the oxide columns 103-1 can be achieved by controlling the etching time. At S700, a first dielectric layer 107 is formed.

Figure 3J:
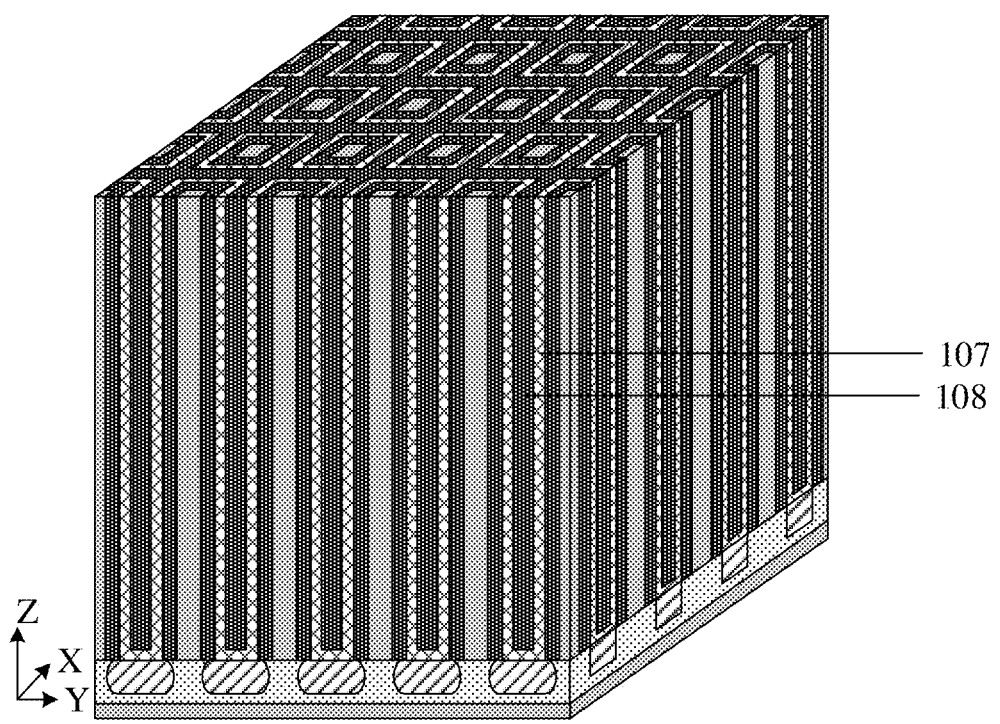

As illustrated in FIG. 3J, the first dielectric layer 107 is formed on the side wall and bottom of the second groove 109.

Here, the first dielectric layer 107 is used as the dielectric medium of a capacitor.

Here, the constituent materials of the first dielectric layer 107 include a material with high dielectric constant (high-K), which generally refers to the material with the dielectric constant higher than, and usually significantly higher than, 3.9. In some specific examples, the materials of the first dielectric layer 107 may include, but are not limited to, aluminum oxide ($Al_2O_3$), zirconium oxide (ZrO), hafnium oxide ($HfO_2$), strontium titanate ($SrTiO_3$), and the like.

At S800, as shown in FIG. 3J, a second electrode 108 is formed.

In some specific embodiments, the constituent material of the second electrode 108 includes, but is not limited to, ruthenium, ruthenium oxide and titanium nitride.

Here, the method for forming the second electrode 108 includes, but is not limited to, PVD, CVD and other processes.

The above embodiments illustrate the process of forming the first active columns 102 on the substrate 101 and forming a storage structure in the gap of the first active columns 102. With the increasing requirements on the density of the memory, the depth-to-width ratio of the first active column 102 is increased. However, under the requirement on the increasing depth-to-width ratio of the first active column 102, if the first active column 102 is formed too high at one time, it is prone to the risk of collapse.

In order to solve the above problem, the embodiments of the present disclosure propose the following solution.

Figure 3K:
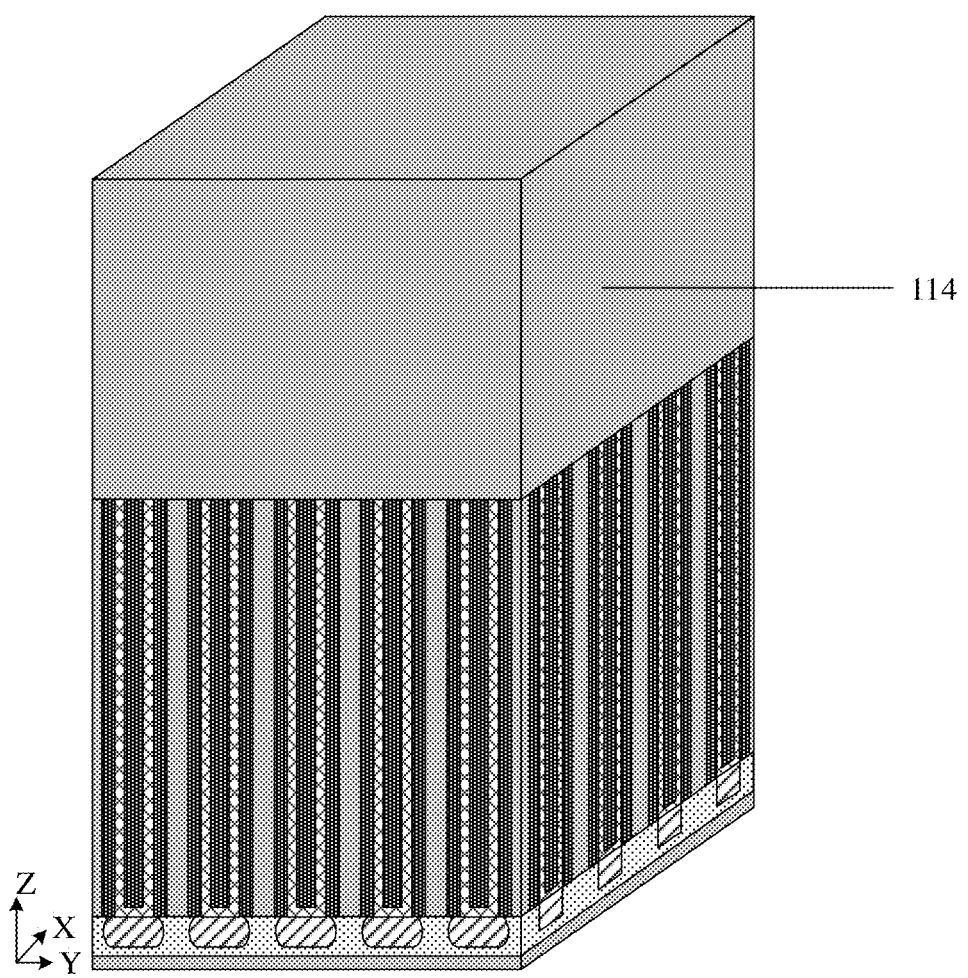
Figure 3L:
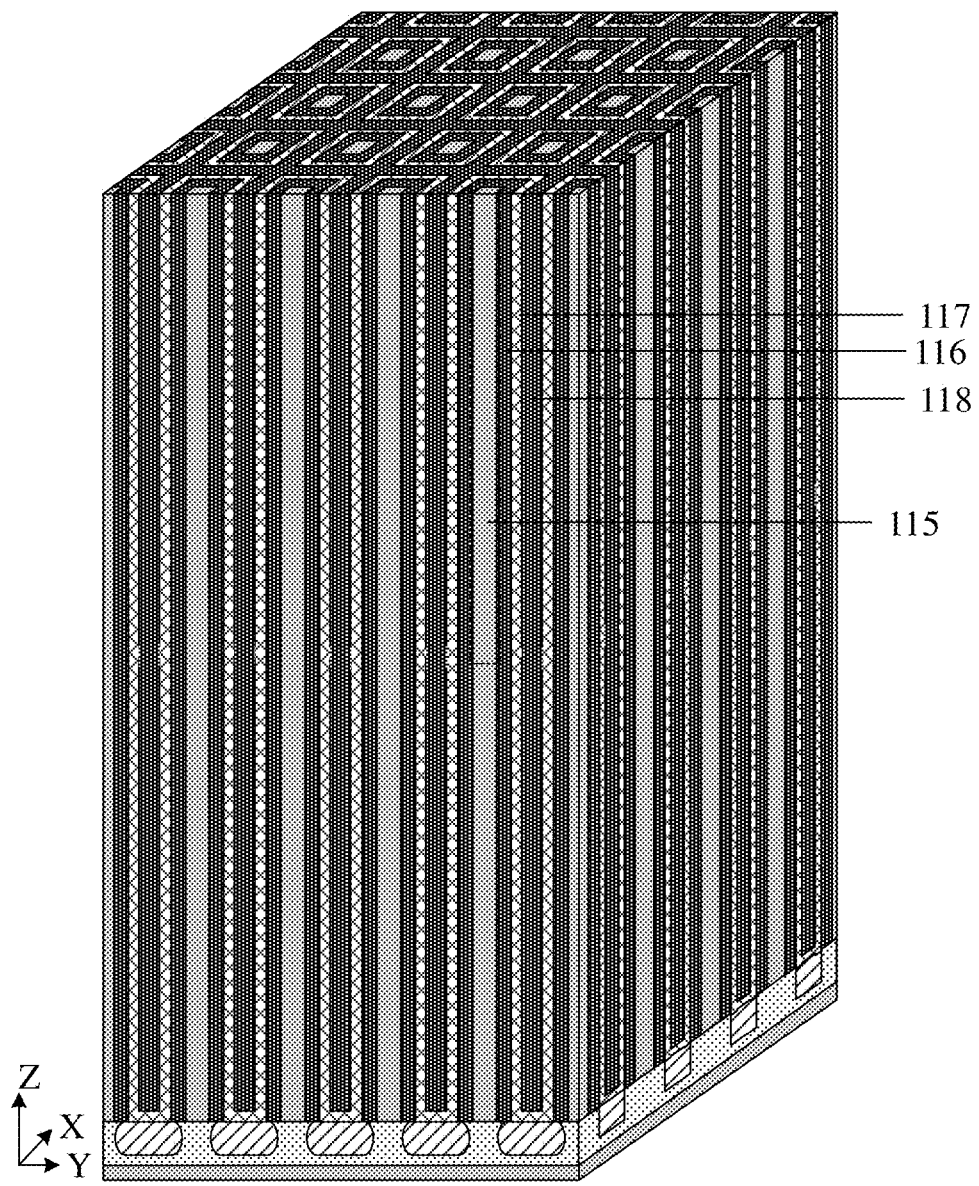

In some embodiments, as shown in FIG. 3L, the method may also include the following operations.

After the second electrode 108 is formed, a plurality of second semiconductor columns are formed on the first active columns 102 and arranged in an array along the first direction and the second direction.

The second semiconductor columns are subjected with an oxidizing treatment, to oxidize exposed surfaces of the second semiconductor columns into third oxide layers.

A second sacrificial material is filled in a gap between the third oxide layers.

The third oxide layer is removed to obtain a second active column 115 and form a third groove.

A third electrode 116 is formed in the third groove.

The sacrificial material is removed to form a fourth groove.

A second dielectric layer 117 is formed on a side wall of the fourth groove.

A fourth electrode 118 is formed in the fourth groove formed with the second dielectric layer 117. The first electrode 106 and the third electrode 116 are connected with each other, the first dielectric layer 107 and the second dielectric layer 117 are connected with each other, and the second electrode 108 and the fourth electrode 118 are connected with each other.

In some embodiments, as shown in FIG. 3K, the formation of the plurality of second semiconductor columns arranged in the array along the first direction and the second direction on the first active columns 102 includes the following operations.

A second semiconductor substrate 114 is formed on the first active columns 102.

A plurality of third trenches arranged at intervals along the first direction and a plurality of fourth trenches arranged at intervals along the second direction are formed in the second semiconductor substrate 114, so as to form a plurality of second semiconductor columns arranged in an array along the first direction and the second direction on the first active columns 102.

Here, the material of the second semiconductor substrate 114 is the same as or different from the material of the substrate 101.

In some embodiments, the formation of second semiconductor substrate 114 on the first active columns 102 may include the following operation.

The second semiconductor substrate 114 is formed on the first active columns 102 via the epitaxial growth technology.

Here, the process of forming the second active columns 115 on the first active columns 102 and forming the third electrode 116, the second dielectric layer 117 and the fourth electrode 118 in the gap between the second active columns 115 is similar to the process of forming the first active columns 102 and forming the first electrode 106, the first dielectric layer 107 and the second electrode 108 in the gap between the first active columns 102 in the above embodiments. Elaborations are omitted herein.

It is understandable that, in the embodiments of the present disclosure, the first active columns 102 are first formed on the substrate 101, and a lower capacitor including the first electrode 106, the first dielectric layer 107 and the second electrode 108 is formed in the gap between the first active columns 102; then, the second semiconductor substrate 114 is formed by epitaxial growth on the first active columns 102, so as to form the second active columns 115, and to form an upper capacitor including the third electrode 116, the second dielectric layer 117 and the fourth electrode 118 in the gap between the second active columns 115. The first electrode 106 of the lower capacitor is connected with the third electrode 116 of the upper capacitor, the second electrode 108 of the lower capacitor is connected with the fourth electrode 118 of the upper capacitor, and the first dielectric layer 107 of the lower capacitor is connected with the second dielectric layer 117 of the upper capacitor. That is, in the embodiments of the present disclosure, a capacitor is formed in two parts to improve the problem of collapse caused by the high depth-to-width ratio of the semiconductor column during the formation of a capacitor in one step.

Next, a transistor (not shown in FIG. 3L) is formed on the top surface of the second active column 115 and a BL is also formed to electrically connect with one of the source and the drain of the transistor. The other one of the source and the drain of the transistor is electrically connected with the capacitor of the semiconductor structure.

In some embodiments, the method may also include the following operations. A plurality of third active columns are formed on the second active column 115 and arranged in an array along the first direction and the second direction. Each of the third active columns is on the top surface of a corresponding second active column 115.

A gate structure covering at least one side of the second active column is formed.

A source and a drain are formed respectively at two opposite ends of the third active column.

Here, the shape of the gate varies in different types of transistors. Exemplarily, in a columnar gate transistor, the gate is formed at one side of the channel area in a columnar form; in a gate-half-around transistor, the gate half surrounds the channel area; and in a Gate All Around (GAA) transistor, the gate completely surrounds the channel area.

The transistors in the embodiments of the present disclosure may be in the above types, but are not limited to this. Preferably, the transistor is a GAA transistor.

It is to be noted that the gate structure herein includes a gate (G) and a gate oxide layer. The gate oxide layer is located between the gate and a channel area, and is used for electrically isolating the channel area and the gate to reduce the hot carrier effect of the transistor.

Here, the material of the gate may include metal or polycrystalline silicon (Poly), etc. The material of the gate oxide layer may include, but is not limited to, silicon oxide.

In some specific examples, the method for forming the gate includes, but is not limited to, PVD, CVD, ALD, or the like. The method for forming the gate oxide layer includes, but is not limited to, in situ oxidation.

In some specific examples, the method for forming the source and the drain includes, but is not limited to, a doping process and a diffusion process.

It is to be noted that the source and the drain located at the two opposite ends of the third active column may be interchanged, which may be determined and set according to actual requirements.

In some embodiments, the method further includes the following operations.

A plurality of bit lines are formed on the third active columns. The plurality of bit lines are electrically contacted with the tops of the third active columns.

It is understandable that the memory in the above embodiments is of Transistor on Capacitor (TOC) structure which also includes the plurality of bit lines located on the transistor and in electrical contact with the tops of the third active columns.

It is understandable that the BL is used for performing a read or write operation on the transistor when the transistor is turned on.

Here, the BL is set above the transistor, and is used as a Metal BL, so as to reduce the resistance and the process difficulty, and to better match with the circuit design scheme of the memory.

It is understandable that, in the embodiments of the present disclosure, a plurality of first semiconductor columns 102-1 are formed on the substrate 101, and each of the semiconductor columns includes the first part 113 and the second part 112 located on the first part 113 with the maximum diameter width of the first part 113 being less than the minimum diameter width of the second part 112. Then, the first part 113 of each of the first semiconductor columns 102-1 is oxidized into a oxide column 103-1 through oxidation treatment, and the corresponding first active column 102 is formed on the top surface of each oxide column 103-1, so that the first active column 102 is insulated from the substrate 101, and thus, the storage structure (e.g. a capacitor) formed in the gap between the first active columns 102 can be insulated from the substrate 101, thereby improving the problem of electric leakage of the storage structure and the reliability of the memory.

The embodiments of the present disclosure provide a method for manufacturing a semiconductor structure, which may include the following operations. A substrate 101 is provided, and a plurality of first semiconductor columns 102-1 are formed on the substrate 101 and arranged in an array along the first direction and the second direction. Both the first direction and the second direction are perpendicular to the extension direction of the first semiconductor column 102-1, and the first direction is intersected with the second direction. The plurality of first semiconductor columns 102-1 are subjected with an oxidizing treatment to form the oxide layers 103 on the surfaces of the first semiconductor columns 102-1. The first sacrificial material 104-1 is filled in the gap between the oxide layers 103. Part of the oxide layer 103 is removed to obtain the first active column 102 and the first groove 105. The first electrode 106 is formed in the first groove 105. Part of the first sacrificial material 104-1 in the gap between the oxide layers 103 is removed to form the second groove 109. The first dielectric layer 107 is formed to cover the side wall and bottom of the second groove 109. The second electrode 108 is formed in the second groove 109 formed with the first dielectric layer 107. In the embodiments of the present disclosure, the plurality of first semiconductor columns 102-1 are first formed on a substrate 101, and the surfaces of the plurality of first semiconductor columns 102-1 are subjected with the oxidizing treatment to form the oxide layers 103; the first sacrificial material 104-1 is filled in the gap between the oxide layers 103. Then, part of each of the oxide layers 103 is removed to form a plurality of first grooves 105 between the plurality of first semiconductor columns 102-1; and the plurality of first electrodes 106 are directly formed in the plurality of first grooves 105. In this way, the plurality of first electrodes 106 formed are independent of each other, thereby improving the problem of mutual interference of the plurality of first electrodes 106, and improving the performance of the semiconductor structure.

According to another aspect of the present disclosure, the embodiments of the present disclosure provide a semiconductor structure. The semiconductor structure includes a plurality of first active columns, a plurality of first electrodes, a plurality of first dielectric layers, and second electrode.

The plurality of first active columns are arranged in an array along a first direction and a second direction. Both the first direction and the second direction are perpendicular to the extension direction of the first active columns, and the first direction is intersected with the second direction.

Each of the first electrodes covers the side wall of one of the first active columns. The first electrodes are located in first grooves arranged at intervals. Each of the first grooves surrounds the surface of each of the first active columns.

Each of the first dielectric layers covers the side wall of one of the first electrodes and the bottom of a gap between two adjacent first electrodes.

The second electrode covers the surfaces of the plurality of first dielectric layers.

In some embodiments, the semiconductor structure further includes a plurality of second active columns, a plurality of third electrodes, a plurality of second dielectric layers and a fourth electrode.

The plurality of second active columns are located on the first active columns. An orthographic projection of each of the second active columns is overlapped with an orthographic projection of a corresponding first active column on the plane where the first direction and the second direction are located.

Each of the third electrodes covers the side wall of one of the second active columns. The third electrodes are located in third grooves arranged at intervals. Each of the third grooves surrounds the surface of each of the second active columns. The third electrode and the first electrode are connected with each other.

Each of the second dielectric layers covers the side wall of one of the third electrodes, and the second dielectric layer and the first dielectric layer are connected with each other.

The fourth electrode covers the plurality of second dielectric layers, and the fourth electrode and the second electrode are connected with each other.

In some embodiments, the semiconductor structure further includes a substrate, a plurality of oxide columns and a first sacrificial layer.

A second oxide layer is formed on the surface of the substrate.

The plurality of oxide columns are located on the second oxide layer, and each of the first active columns is located on the top surface of a corresponding oxide column.

The first sacrificial layer is located in the gap between the plurality of the oxide columns.

The first dielectric layer covers the side wall of the first electrode and the top surface of the first sacrificial layer.

In some embodiments, the semiconductor structure further includes a plurality of third active columns and a plurality of transistors.

Each of the third active columns is located on the top surface of a corresponding first active column.

A channel structure of each of the transistors is located in the third active column, and the extension direction of the channel structure is perpendicular to the plane where the first direction and the second direction are located.

In some embodiments, the transistor includes a gate structure, a source, and a drain.

The gate structure is arranged at least around one side of the third active column.

The source and the drain are respectively arranged at two opposite ends of the third active column.

In some embodiments, the semiconductor structure further includes a plurality of bit lines.

The plurality of bit lines are located above the transistor and in electrical contact with the top of the third active column.

According to yet another aspect of the present disclosure, the embodiments of the present disclosure also provide a memory including one or more semiconductor structures as described in any of the above embodiments of the present disclosure.

The semiconductor structure and memory provided in the above embodiments have been described in detail in aspect of the method and will not be repeated here.

It is understandable that, in the embodiments of the present disclosure, the first electrodes formed are located in the first grooves arranged at intervals, and each of the first grooves surrounds the surface of each of the first active columns. That is, the plurality of first electrodes formed in the embodiments of the present disclosure are independent of each other, thus the problem of mutual interference among the plurality of first electrodes can be improved, and the performance of the semiconductor structure can be improved.

In the embodiments provided by the disclosure, it should be understood that the device and method provided may be implemented in a non-targeted manner. The device provided in the embodiments described above is only schematic. For example, division of the units is only logic function division, and other division manners may be adopted during practical implementation. For example, multiple units or components may be combined or integrated into another system, or some features may be omitted or not executed. In addition, the components shown or discussed can be coupled or directly coupled.

The features disclosed in method or device embodiments provided in the present disclosure may be freely combined without conflicts to obtain new method embodiments or device embodiments.

The above is only the specific implementation modes of the present disclosure and not intended to limit the protection scope of the present disclosure. Any change or replacement that those skilled in the art can think of easily in the scope of technologies disclosed by the present disclosure shall fall within the protection scope of the present disclosure. Therefore, the scope of protection of the present disclosure shall be limited to the appended claims.

INDUSTRIAL APPLICABILITY

In the embodiments of the present disclosure, a plurality of first semiconductor columns are first formed on a substrate, and the surfaces of the plurality of first semiconductor columns are subjected with an oxidizing treatment to form oxide layers; a first sacrificial material is filled in the gap between the oxide layers, and then part of the oxide layers is removed to form a plurality of first grooves among the plurality of first semiconductor columns, and thus to directly form a plurality of first electrodes in the plurality of first grooves. In this way, the plurality of first electrodes formed are independent of each other, thereby improving the problem of mutual interference of the plurality of first electrodes, and thus improving the performance of the semiconductor structure.

The invention claimed is:

1. A semiconductor structure, comprising:
    a plurality of first active columns, arranged in an array along a first direction and a second direction; wherein both the first direction and the second direction are perpendicular to an extension direction of the first active column, and the first direction is intersected with the second direction;
    a plurality of first electrodes, located in first grooves arranged at intervals; wherein each of the first electrodes covers a side wall of one of the first active columns, and each of the first grooves surrounds a surface of each of the first active columns;
    a plurality of first dielectric layers; wherein each of the first dielectric layers covers a side wall of one of the first electrodes and a bottom of a gap between two adjacent first electrodes; and
    second electrodes covering surfaces of the plurality of first dielectric layers;
    wherein the semiconductor structure further comprises:
    a substrate: wherein a second oxide layer is formed on a surface of the substrate;
    a plurality of oxide columns located on the second oxide layer; wherein each of the first active columns is located on and in contact with a top surface of a corresponding oxide column; and
    a first sacrificial layer located in a gap between the plurality of the oxide columns:
    wherein the first dielectric layer covers the side wall of the first electrode and a top surface of the first sacrificial layer.

2. The semiconductor structure of claim 1, wherein the semiconductor structure further comprises:
    a plurality of second active columns located on the first active columns; wherein an orthographic projection of each of the second active columns is overlapped with an orthographic projection of a corresponding first active column on a plane where of the first direction and the second direction are located;
    a plurality of third electrodes located in third grooves arranged at intervals; wherein each of the third electrodes covers a side wall of one of the second active columns, each of the third grooves surrounds a surface of each of the second active columns, and the third electrode and the first electrode are connected with each other;
    a plurality of second dielectric layers; wherein each of the second dielectric layers covers a side wall of one of the third electrodes, and the second dielectric layer and the first dielectric layer are connected with each other; and
    fourth electrodes covering the plurality of second dielectric layers, wherein the fourth electrode and the second electrode are connected with each other.

3. The semiconductor structure of claim 1, wherein the semiconductor structure further comprises:
    a plurality of third active columns, wherein each of the third active columns is located on a top surface of a corresponding first active column; and
    a plurality of transistors, wherein each of the transistors has a channel structure located in the third active column and having an extension direction perpendicular to the plane where the first direction and the second direction are located.

4. The semiconductor structure of claim 3, wherein the transistor comprises:
    a gate structure arranged at least around one side of the third active column; and
    a source and a drain respectively arranged at two opposite ends of the third active column.

5. The semiconductor structure of claim 3, wherein the semiconductor structure further comprises:
    a plurality of bit lines, located above the transistor and in electrical contact with tops of the third active columns.

6. A memory comprising at least one semiconductor structure of claim 1.

7. A method for manufacturing a semiconductor structure, comprising:
    providing a substrate, and forming a plurality of first semiconductor columns arranged in an array along a first direction and a second direction on the substrate; wherein both the first direction and the second direction are perpendicular to an extension direction of the first semiconductor column, and the first direction is intersected with the second direction;

performing an oxidizing treatment on the plurality of first semiconductor columns to form oxide layers on surfaces of the first semiconductor columns;

filling a first sacrificial material in a gap between the oxide layers;

removing part of the oxide layer to obtain a first active column and a first groove;

forming a first electrode in the first groove;

removing part of the first sacrificial material in the gap between the oxide layers to form a second groove;

forming a first dielectric layer covering the side wall and bottom of the second groove; and forming a second electrode in the second groove formed with the first dielectric layer:

wherein each of the first semiconductor columns to comprise a first part and a second part located on the first part, and a maximum diameter width of the first part is less than a minimum diameter width of the second part;

the formation of the oxide layers on the surfaces of the first semiconductor columns comprises:

performing the oxidizing treatment on the first semiconductor columns, to completely oxidize the first part into an oxide column, to oxidize an exposed surface of the second part into a first oxide layer, and to oxidize a surface of the substrate into a second oxide layer.

8. The method for manufacturing a semiconductor structure of claim 7, wherein the formation of the plurality of first semiconductor columns arranged in an array along the first direction and the second direction comprises:

etching the substrate to form a plurality of first trenches arranged at intervals along the first direction and a plurality of second trenches arranged at intervals along the second direction on the substrate, and performing an enlarging treatment on a bottom of the first trench and/or a bottom of the second trench, to make each of the first semiconductor columns to comprise the first part and the second part.

9. The method for manufacturing a semiconductor structure of claim 7, wherein the filling of the first sacrificial material in the gap between the oxide layers comprises:

filling the first sacrificial material in a gap between the plurality of oxide columns and a gap between the first oxide layers;

removing the first sacrificial material in the gap between the first oxide layers to form the second groove, and retaining the first sacrificial material in the gap of the plurality of the oxide columns to form a first sacrificial layer.

10. The method for manufacturing a semiconductor structure of claim 7, further comprising:

after the second electrode is formed, forming a plurality of second semiconductor columns arranged in an array along the first direction and the second direction on the first active columns;

performing an oxidizing treatment on the second semiconductor columns, to oxidize exposed surfaces of the second semiconductor columns into third oxide layers;

filling a second sacrificial material in the gap between the third oxide layers;

removing the third oxide layer to obtain a second active column and form a third groove;

forming a third electrode in the third groove;

removing the second sacrificial material to form a fourth groove;

forming a second dielectric layer on a side wall of the fourth groove; and forming a fourth electrode in the fourth groove formed with the second dielectric layer; wherein the first electrode and the third electrode are connected with each other, the first dielectric layer and the second dielectric layer are connected with each other, and the second electrode and the fourth electrode are connected with each other.

11. The method for manufacturing a semiconductor structure of claim 10, wherein the formation of the plurality of second semiconductor columns arranged in the array along the first direction and the second direction on the first active columns comprises:

forming a second semiconductor substrate on the first active columns;

forming a plurality of third trenches arranged at intervals spaced along the first direction and a plurality of fourth trenches spaced along the second direction in the second semiconductor substrate, so as to form the plurality of second semiconductor columns arranged in the array along the first direction and the second direction on the first active columns.

12. The method for manufacturing a semiconductor structure of claim 11, wherein the formation of the second semiconductor substrate on the first active columns comprises:

forming the second semiconductor substrate on the first active columns via an epitaxial growth technology.

13. The method for manufacturing a semiconductor structure of claim 7, further comprising:

forming a plurality of third active columns arranged in an array along the first direction and the second direction on the first active columns; wherein each of the third active columns is located on a top surface of a corresponding first active column;

forming a gate structure covering at least one side of the second active column; and forming a source and a drain respectively at two opposite ends of the third active column.

14. The method for manufacturing a semiconductor structure of claim 13, further comprising:

forming a plurality of bit lines on the third active columns and in electrical contact with tops of the third active columns.

15. A method for manufacturing a semiconductor structure, comprising:

providing a substrate, and forming a plurality of first semiconductor columns arranged in an array along a first direction and a second direction on the substrate; wherein both the first direction and the second direction are perpendicular to an extension direction of the first semiconductor column, and the first direction is intersected with the second direction;

performing an oxidizing treatment on the plurality of first semiconductor columns to form oxide layers on surfaces of the first semiconductor columns;

filling a first sacrificial material in a gap between the oxide layers;

removing part of the oxide layer to obtain a first active column and a first groove;

forming a first electrode in the first groove;

removing part of the first sacrificial material in the gap between the oxide layers to form a second groove;

forming a first dielectric layer covering the side wall and bottom of the second groove;

forming a second electrode in the second groove formed with the first dielectric layer;

forming a plurality of second semiconductor columns arranged in an array along the first direction and the second direction on the first active columns;

performing an oxidizing treatment on the second semiconductor columns, to oxidize exposed surfaces of the second semiconductor columns into third oxide layers;

filling a second sacrificial material in the gap between the third oxide layers;

removing the third oxide layer to obtain a second active column and form a third groove;

forming a third electrode in the third groove;

removing the second sacrificial material to form a fourth groove;

forming a second dielectric layer on a side wall of the fourth groove; and forming a fourth electrode in the fourth groove formed with the second dielectric layer; wherein the first electrode and the third electrode are connected with each other, the first dielectric layer and the second dielectric layer are connected with each other, and the second electrode and the fourth electrode are connected with each other.

16. The method for manufacturing a semiconductor structure of claim 15, wherein the formation of the plurality of second semiconductor columns arranged in the array along the first direction and the second direction on the first active columns comprises:

forming a second semiconductor substrate on the first active columns;

forming a plurality of third trenches arranged at intervals spaced along the first direction and a plurality of fourth trenches spaced along the second direction in the second semiconductor substrate, so as to form the plurality of second semiconductor columns arranged in the array along the first direction and the second direction on the first active columns.

17. The method for manufacturing a semiconductor structure of claim 16, wherein the formation of the second semiconductor substrate on the first active columns comprises:

forming the second semiconductor substrate on the first active columns via an epitaxial growth technology.

18. The method for manufacturing a semiconductor structure of claim 15, further comprising:

forming a plurality of third active columns arranged in an array along the first direction and the second direction on the first active columns; wherein each of the third active columns is located on a top surface of a corresponding first active column;

forming a gate structure covering at least one side of the second active column; and forming a source and a drain respectively at two opposite ends of the third active column.

19. The method for manufacturing a semiconductor structure of claim 18, further comprising:

forming a plurality of bit lines on the third active columns and in electrical contact with tops of the third active columns.

\* \* \* \* \*